(12) United States Patent
Ohno et al.

(10) Patent No.: US 12,342,506 B2
(45) Date of Patent: Jun. 24, 2025

(54) THERMAL DISSIPATION STRUCTURE AND DRIVE UNIT

(71) Applicant: EXEDY Corporation, Neyagawa (JP)

(72) Inventors: Taichi Ohno, Neyagawa (JP); Taichi Kitamura, Neyagawa (JP)

(73) Assignee: EXEDY CORPORATION, Neyagawa (JP)

( * ) Notice: Subject to any disclaimer, the term of this patent is extended or adjusted under 35 U.S.C. 154(b) by 259 days.

(21) Appl. No.: 18/300,308

(22) Filed: Apr. 13, 2023

(65) Prior Publication Data

US 2023/0371207 A1    Nov. 16, 2023

(30) Foreign Application Priority Data

May 13, 2022    (JP) .................................. 2022-079593

(51) Int. Cl.
*H05K 7/20* (2006.01)
*B66F 9/075* (2006.01)

(52) U.S. Cl.
CPC ........ *H05K 7/2039* (2013.01); *B66F 9/07595* (2013.01)

(58) Field of Classification Search
CPC .......................... H05K 7/2039; B66F 9/07595
USPC ......................................................... 361/709
See application file for complete search history.

(56) References Cited

U.S. PATENT DOCUMENTS

| 2012/0287578 | A1* | 11/2012 | Huang | H04B 1/036 361/714 |
| 2016/0024358 | A1* | 1/2016 | Zambova | C08L 83/00 252/75 |
| 2016/0137084 | A1* | 5/2016 | Shinada | B60L 53/30 320/107 |
| 2023/0389232 | A1* | 11/2023 | Ahamed | G02B 6/4269 |
| 2023/0422451 | A1* | 12/2023 | Gebers | H05K 7/20418 |

FOREIGN PATENT DOCUMENTS

| JP | 2013251328 A | * 12/2013 | ............... H05K 5/06 |
| JP | 2020-174126 A | 10/2020 | |

* cited by examiner

*Primary Examiner* — Zhengfu J Feng
(74) *Attorney, Agent, or Firm* — United IP Counselors, LLC

(57) ABSTRACT

A thermal dissipation structure includes a housing, a thermal dissipation mechanism, and a seal member. The housing accommodates a heat-generating element. The thermal dissipation mechanism includes a thermal transfer part and a thermal dissipation part. The thermal transfer part is disposed inside the housing. The thermal transfer part is configured to transfer heat generated by the heat-generating element. The thermal dissipation part is disposed outside the housing. The seal member seals between the housing and the thermal dissipation mechanism.

7 Claims, 4 Drawing Sheets

THERMAL DISSIPATION STRUCTURE AND DRIVE UNIT

CROSS-REFERENCE TO RELATED APPLICATIONS

This application claims priority to Japanese Patent Application No. 2022-079593, filed May 13, 2022, the contents of which are incorporated by reference herein in their entirety.

TECHNICAL FIELD

The present invention relates to a thermal dissipation structure and a drive unit.

BACKGROUND

In general, electric products include an electronic board disposed inside the housing thereof. Heat-generating elements such as semiconductor elements are attached onto the electronic board. For example, Japan Laid-open Patent Application Publication No. 2020-174126 discloses a thermal dissipation structure for cooling the heat-generating elements. In the thermal dissipation structure, the housing is provided with an intake port and an exhaust port; in addition, a cooling fan is installed inside the housing.

In the thermal dissipation structure described above, dust, rainwater, or so forth enters the housing through the intake port and the exhaust port; hence, the thermal dissipation structure is not suitable for a product requiring dust-proofness and water-proofness.

In view of the above, it is an object of the present invention to provide a thermal dissipation structure, whereby dust-proofness and water-proofness can be reliably achieved.

BRIEF SUMMARY

A thermal dissipation structure according to a first aspect is configured to cool a heat-generating element. The thermal dissipation structure includes a housing, a thermal dissipation mechanism, and a seal member. The housing accommodates the heat-generating element. The thermal dissipation mechanism includes a thermal transfer part and a thermal dissipation part. The thermal transfer part is disposed inside the housing. The thermal transfer part is configured to transfer heat generated by the heat-generating element. The thermal dissipation part is disposed outside the housing. The seal member seals between the housing and the thermal dissipation mechanism.

According to the configuration described above, the heat, generated by the heat-generating element accommodated in the housing, is transferred to the thermal dissipation part through the thermal transfer part; then, the heat is discharged from the thermal dissipation part to the atmosphere outside the housing. The housing and the thermal dissipation mechanism are sealed therebetween by the seal member; hence, dust-proofness and water-proofness can be reliably achieved.

A thermal dissipation structure according to a second aspect relates to the thermal dissipation structure according to the first aspect and is configured such that the thermal dissipation mechanism is a heat sink provided as a single member.

A thermal dissipation structure according to a third aspect relates to the thermal dissipation structure according to the first or second aspect and further includes a thermal insulation part disposed to surround the thermal transfer part.

A thermal dissipation structure according to a fourth aspect relates to the thermal dissipation structure according to any of the first to third aspects and further includes an attachment bolt penetrating the housing to extend outside from the housing. The thermal dissipation part includes a screw hole not penetrating therethrough. The attachment bolt is screwed into the screw hole.

A thermal dissipation structure according to a fifth aspect relates to the thermal dissipation structure according to any of the first to fourth aspects and is configured such that the housing includes an opening making inside and outside of the housing communicate with each other. The opening is directed in a horizontal direction.

A thermal dissipation structure according to a sixth aspect relates to the thermal dissipation structure according to the fifth aspect and further includes an electronic board disposed inside the housing. The heat-generating element is attached to the electronic board. The electronic board is disposed to be opposed to the opening.

A drive unit according to a seventh aspect includes the thermal dissipation structure recited in any of the first to sixth aspects, a battery, and an electric motor. The battery is disposed inside the housing. The electric motor is driven by the battery.

Overall, it is possible to realize a thermal dissipation structure with dust-proofness and water-proofness.

DETAILED DESCRIPTION

Figure 1:
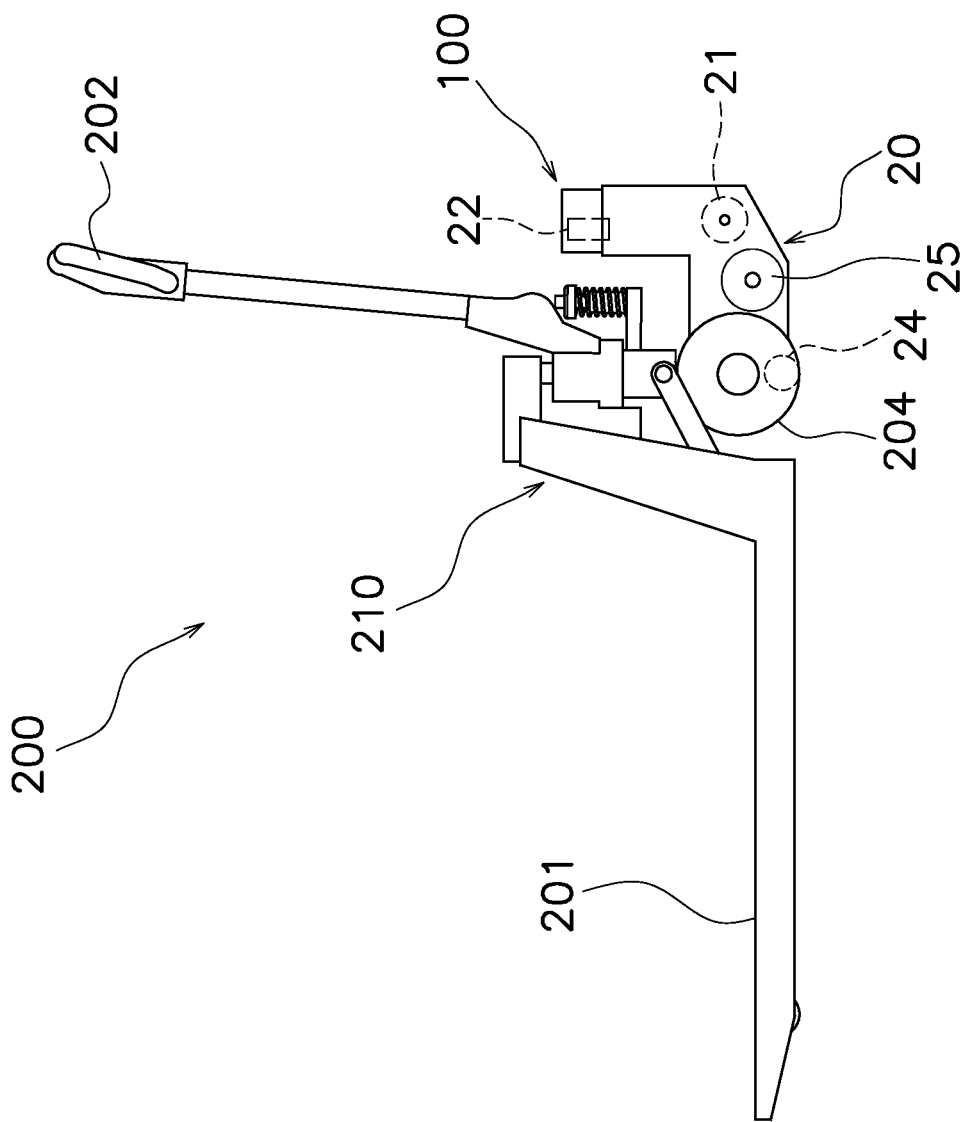
FIG. 1 is a side view of a pallet truck.

A thermal dissipation structure according to the present preferred embodiment will be hereinafter explained with reference to drawings. It should be noted that FIG. 1 is a side view of a pallet truck embedded with a drive unit to which the thermal dissipation structure according to the present preferred embodiment is applied. It should be noted that the drive unit, to which the thermal dissipation structure is applied, can be also embedded in a mobile object other than the pallet truck (e.g., a hand lift truck, a hand truck, or a wheelchair) or so forth. The thermal dissipation structure is also applicable to an electric product other than the drive unit.

As shown in FIG. 1, a pallet truck 200 includes a pallet truck body 210 and a drive unit 20. The pallet truck body 210 includes a loading platform (a pair of fork arms) 201, an operating handle 202, and a plurality of vehicle wheels 204. It should be noted that each vehicle wheel 204 is a non-drive wheel. The drive unit 20 is attached to the pallet truck body 210.

Drive Unit

The drive unit 20 includes an electric motor 21, a battery 22, and a thermal dissipation structure 100. Additionally, the drive unit 20 includes a drive wheel 24, a reducer 25, and so forth.

When the pallet truck 200 travels under human drive force provided by a user, the electric motor 21 outputs an assist force for assisting traveling of the pallet truck 200. The electric motor 21 rotates and drives the drive wheel 24.

The battery 22 is configured to supply electric power to the electric motor 21 and so forth. An electronic board 9 is electrically connected to the battery 22. A plurality of semiconductor elements and so forth are soldered to the electronic board 9. It should be noted that the battery 22 and the electronic board 9 are accommodated in a housing 3 (to be described).

The reducer 25 reduces the speed of rotation of the electric motor 21 and transmits the rotation reduced in speed to the drive wheel 24. The reducer 25 is composed of, for instance, a plurality of gears and so forth.

[Thermal Dissipation Structure]

Figure 2:
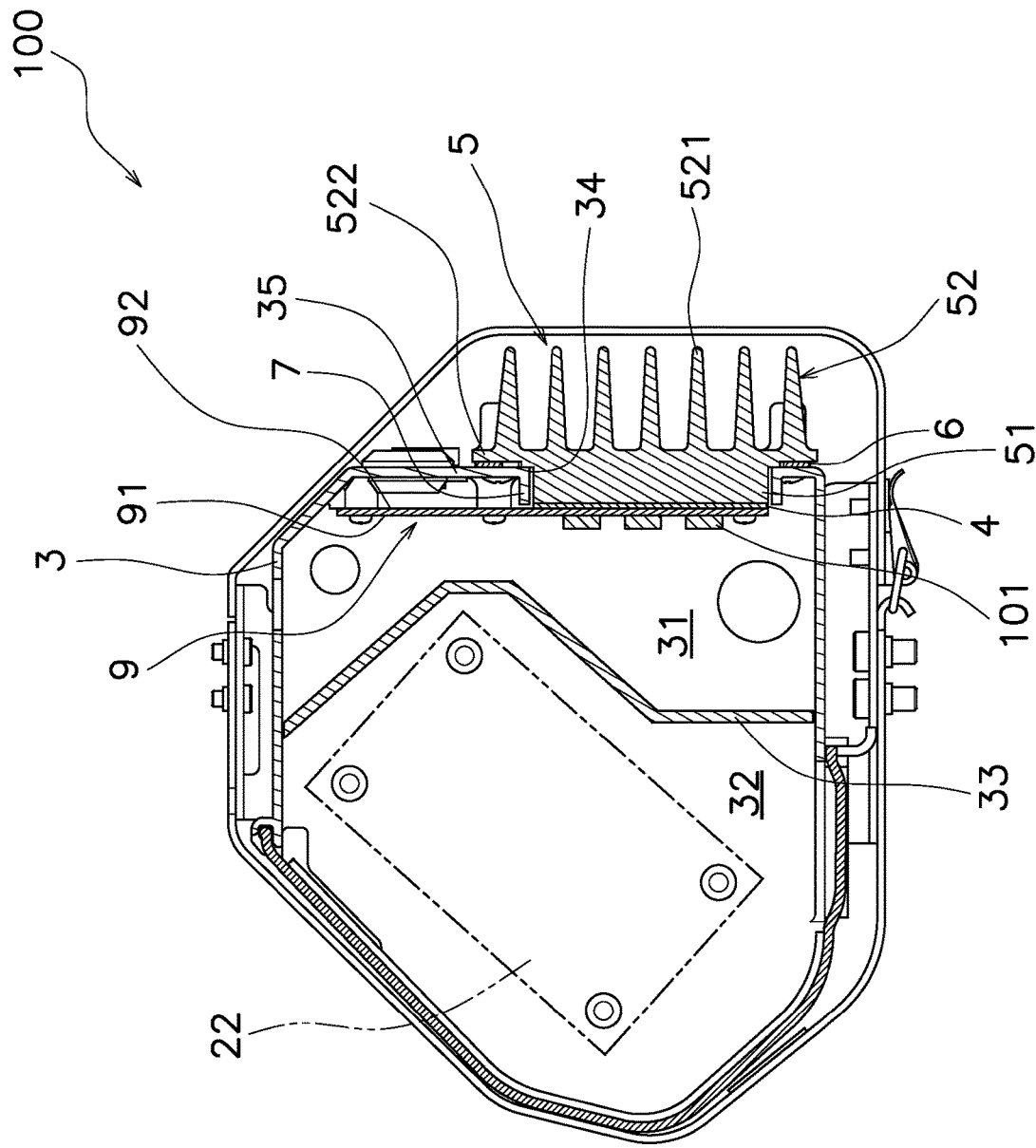
FIG. 2 is a cross-sectional view of a thermal dissipation structure seen from above.

FIG. 2 is a cross-sectional view of the thermal dissipation structure seen from above. As shown in FIG. 2, the thermal dissipation structure 100 is configured to cool a plurality of heat-generating elements 101. The thermal dissipation structure 100 includes the housing 3, a thermal dissipation sheet 4, a thermal dissipation mechanism 5, a seal member 6, and a thermal insulation part 7. In addition, the thermal dissipation structure 100 includes a plurality of attachment bolts 8 and the electronic board 9 as well (see FIG. 4).

[Housing]

The housing 3 is configured to accommodate a variety of components. When described in detail, the housing 3 accommodates the electronic board 9 in the interior thereof. In addition, the housing 3 accommodates the battery 22 in the interior thereof. The housing 3 ensures airtightness so as to prevent dust, rainwater, and so forth from entering the interior thereof.

The housing 3 includes a first space 31 for accommodating the electronic board 9 and a second space 32 for accommodating the battery 22. In other words, the housing 3 is divided into two spaces through a partition 33. It should be noted that the housing 3 is made of, for instance, synthetic resin such as ABS (Acrylonitrile Butadiene Styrene) resin, ASA (Acrylonitrile Styrene Acrylate) resin, or PES (Polyethersulfone) resin, or so forth.

The electronic board 9 is vertically set in the housing 3. In other words, the electronic board 9 is disposed along a vertical direction. The plural heat-generating elements 101 are soldered onto the electronic board 9. The heat-generating elements 101 are, for instance, semiconductor elements such as transistors. The heat-generating elements 101 are disposed on a first principal surface 91 of the electronic board 9. Heat, generated from the heat-generating elements 101, is transferred to the thermal dissipation sheet 4, disposed on a second principal surface 92 of the electronic board 9, through a plurality of thermal via holes or through holes (not shown in the drawings) provided in the electronic board 9. It should be noted that the heat-generating elements 101 may be disposed on the second principal surface 92 of the electronic board 9, while in direct contact with the thermal dissipation sheet 4.

The housing 3 includes an opening 34. The opening 34 places the inside and outside of the housing 3 in communication with each other. The opening 34 is provided in a sidewall portion 35 of the housing 3. The sidewall portion 35 is opposed to the electronic board 9. The opening 34 penetrates the sidewall portion 35 in a first direction. The plural heat-generating elements 101 are disposed within the range of the opening 34 as seen in the first direction. It should be noted that in the present preferred embodiment, the opening 34 is directed in a horizontal direction. The electronic board 9 is disposed to be opposed to the opening 34. When described in detail, the second principal surface 92 of the electronic board 9 is opposed to the opening 34.

[Thermal Dissipation Sheet]

The thermal dissipation sheet 4 is disposed between the plural heat-generating elements 101 and the thermal dissipation mechanism 5. It should be noted that in the present preferred embodiment, the thermal dissipation sheet 4 is disposed between the plural thermal via holes for transferring the heat generated by the heat-generating elements 101 and the thermal dissipation mechanism 5. The thermal dissipation sheet 4 is in contact with the plural thermal via holes and the thermal dissipation mechanism 5. The thermal dissipation sheet 4 is configured to fill one or more gaps between the thermal via holes.

[Thermal Dissipation Mechanism]

Figure 3:
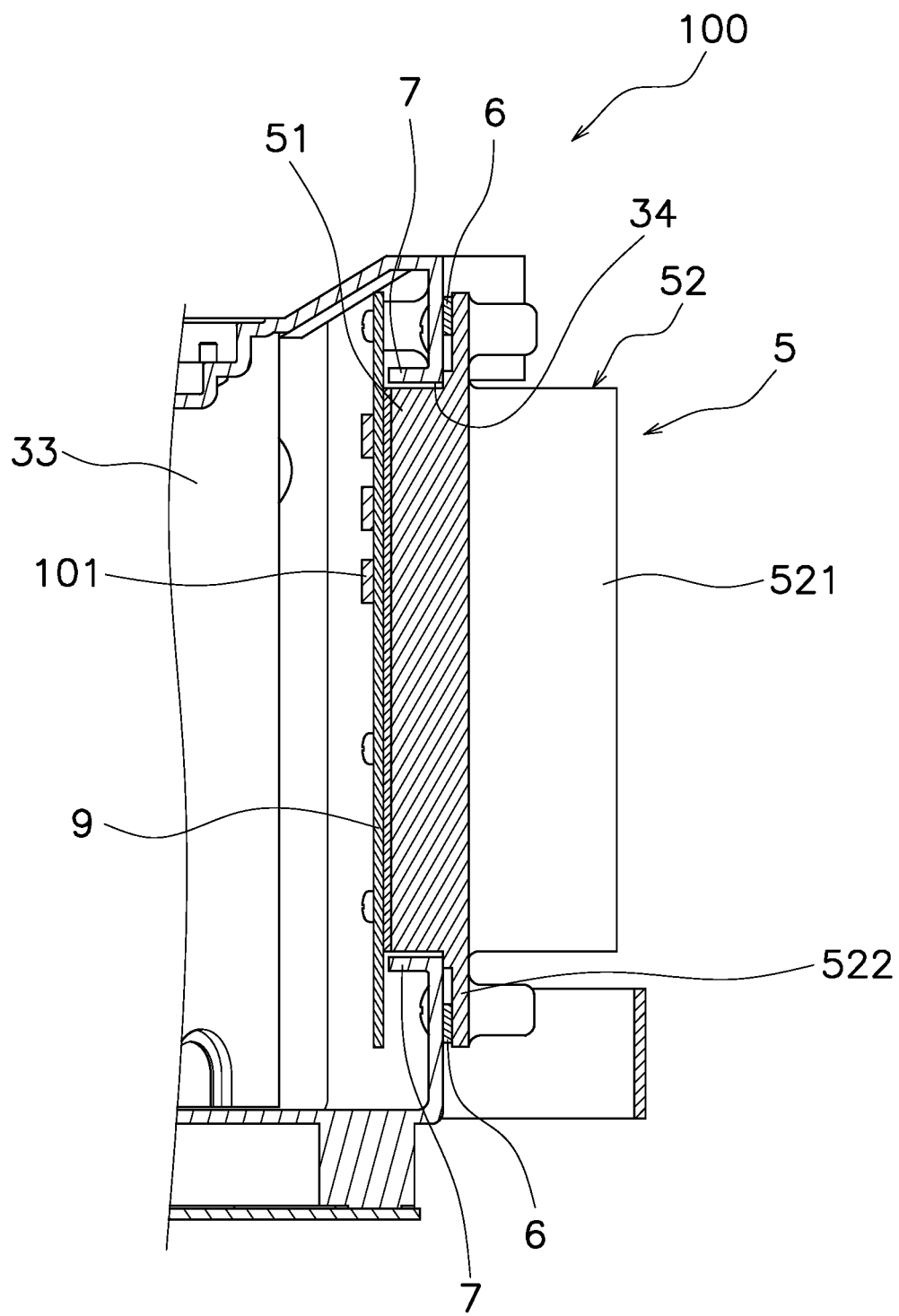
FIG. 3 is an enlarged cross-sectional view of the thermal dissipation structure seen from a lateral side.

FIG. 3 is an enlarged cross-sectional view of the thermal dissipation structure seen from a lateral side. As shown in FIGS. 2 and 3, the thermal dissipation mechanism 5 includes a thermal transfer part 51 and a thermal dissipation part 52. The thermal transfer part 51 and the thermal dissipation part 52 are provided as a single member integrated with each other. The thermal dissipation mechanism 5 is, for instance, a heat sink provided as a single member. The thermal dissipation mechanism 5 extends from the inside to the outside of the housing 3 through the opening 34.

The thermal transfer part 51 is disposed inside the housing 3. It should be noted that the thermal transfer part 51 may be disposed in a range from the inside to the outside of the housing 3. The thermal transfer part 51 is configured to transfer the heat generated by the heat-generating elements 101. It should be noted that in the present preferred embodiment, the heat generated by the heat-generating elements 101 is transferred to the thermal transfer part 51 through the thermal via holes and the thermal dissipation sheet 4. Then, the thermal transfer part 51 transfers the heat to the thermal dissipation part 52.

The thermal dissipation part 52 is disposed outside the housing 3. The thermal dissipation part 52 is configured to discharge the heat of the heat-generating elements 101, transferred thereto through the thermal transfer part 51, to the atmosphere outside the housing 3. The thermal dissipation part 52 includes, for instance, thermal dissipation fins 521 and a flange portion 522. The flange portion 522 is made in the shape of an annulus slightly greater in size than the opening 34 of the housing 3. The flange portion 522 is disposed to surround the opening 34.

Figure 4:
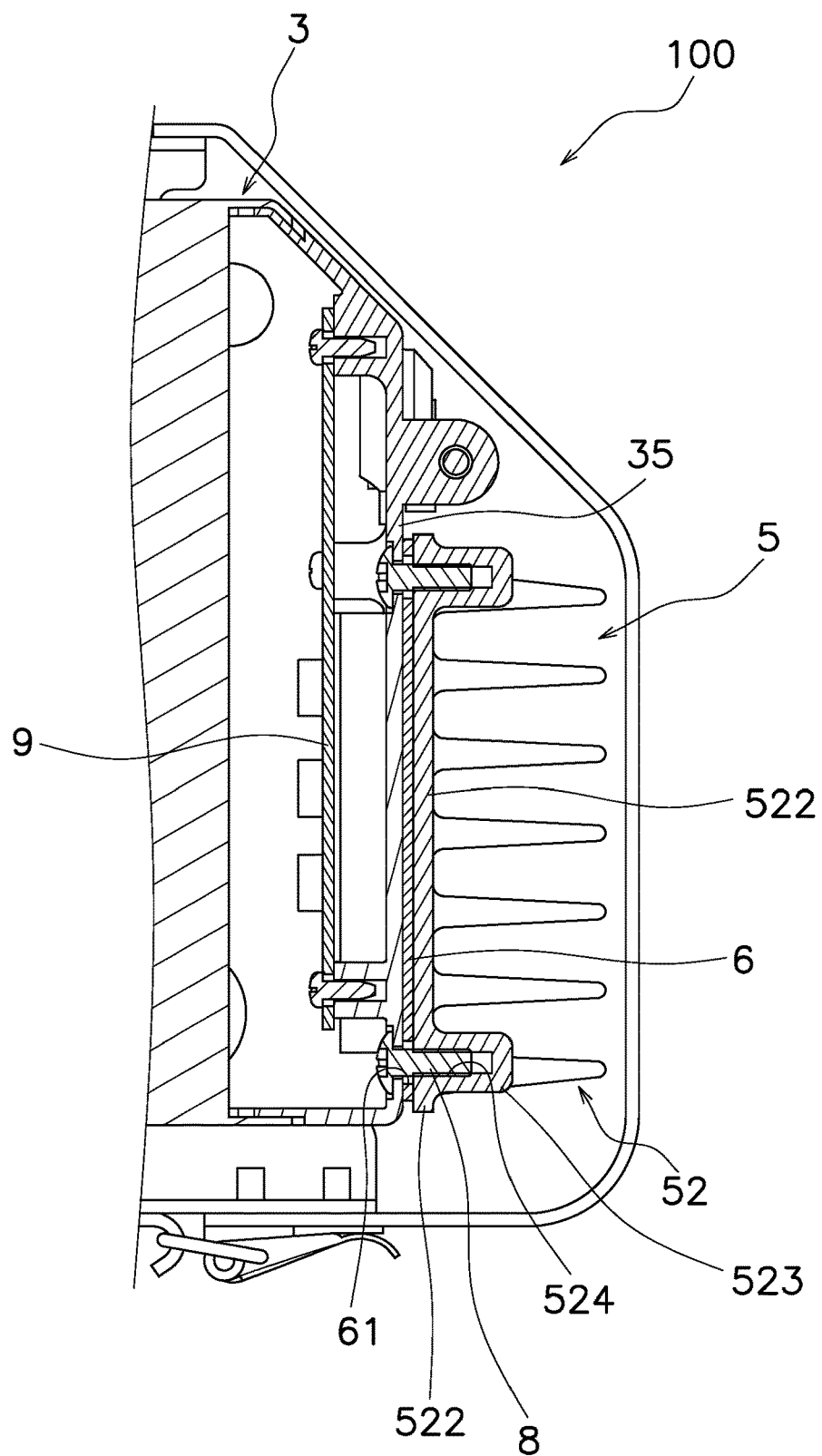
FIG. 4 is an enlarged cross-sectional view of the thermal dissipation structure seen from above.

As shown in FIG. 4, the thermal dissipation part 52 includes a plurality of protruding portions 523. The protruding portions 523 are provided in the flange portion 522. The protruding portions 523 protrude from the flange portion 522 to the opposite side of the housing 3.

The thermal dissipation part 52 includes a plurality of screw holes 524. Each screw hole 524 is provided in each protruding portion 523. Each screw hole 524 is made in the shape of a recess without being penetrated. The screw holes 524 do not communicate with the outside of the housing 3. The screw holes 524 are opened to the interior of the housing 3 through a plurality of through holes provided in the housing 3, respectively. It should be noted that the screw holes 524 and the interior of the housing 3 communicate through openings 61 provided in the seal member 6. Because of this, the screw holes 524 and the interior of the housing 3 communicate with each other in an airtightly sealed manner.

The attachment bolts 8 are screwed into the screw holes 524, respectively. It should be noted that the head part of each attachment bolt 8 is disposed inside the housing 3, while the threaded part thereof extends to the outside of the housing 3. Each attachment bolt 8 extends to the outside of the housing 3, while penetrating the sidewall portion 35 of the housing 3; then, each attachment bolt 8 is screwed into each screw hole 524 outside the housing 3. The thermal dissipation mechanism 5 is attached to the housing 3 by the attachment bolts 8.

[Seal Member]

As shown in FIGS. 2 to 4, the seal member 6 seals between the thermal dissipation mechanism 5 and the housing 3. The seal member 6 is made in the shape of an annulus. The seal member 6 is disposed to surround the opening 34. The seal member 6 is compressed between the housing 3 and the flange portion 522. The seal member 6 prevents dust and rainwater from intruding into the housing 3 through the opening 34. The seal member 6 can be made of, for instance, natural rubber, synthetic rubber, liquid gasket, metal (metal seal), or so forth.

[Thermal Insulation Part]

The thermal insulation part 7 is disposed to surround the thermal transfer part 51. The thermal insulation part 7 is made in the shape of a tube. When described in detail, the thermal insulation part 7 extends along the outer peripheral edge of the opening 34 and extends from the outer peripheral edge of the opening 34 toward the interior of the housing 3. When described in detail, the thermal insulation part 7 extends from the sidewall portion 35 toward the electronic board 9. It should be noted that the thermal insulation part 7 is disposed away from the electronic board 9 at an interval; alternatively, the thermal insulation part 7 may be in contact with the electronic board 9.

The thermal insulation part 7 is disposed away from the thermal transfer part 51 at an interval. In the present preferred embodiment, the thermal insulation part 7 is provided as part of the housing 3; alternatively, the thermal insulation part 7 may be provided as a member separated from the housing 3. As another alternative, the thermal insulation part 7 may be wound about the thermal transfer part 51. In other words, the thermal insulation part 7 may be in contact with the thermal transfer part 51.

The thermal insulation part 7 is made of a material having a lower thermal conductivity than the thermal transfer part 51. For example, the thermal insulation part 7 can be made of synthetic resin such as ABS resin, ASA resin, or PES resin in comparable manner to the housing 3; alternatively, the thermal insulation part 7 can be made of silicone resin, having a lower thermal conductivity than the synthetic resin herein described, or so forth. With the thermal insulation part 7 provided as described above, the heat transferred through the thermal transfer part 51 can be inhibited from being discharged to the interior of the housing.

[Modifications]

One preferred embodiment of the present invention has been explained above. However, the present invention is not limited to the above, and a variety of changes can be made without departing from the gist of the present invention. It should be noted that basically speaking, modifications to be described are applicable simultaneously.

(a) In the preferred embodiment described above, the thermal dissipation mechanism 5 has been explained as the heat sink provided as a single member; however, the configuration of the thermal dissipation mechanism 5 is not limited to this. For example, the thermal dissipation mechanism 5 may be composed of two or more members.

(b) In the preferred embodiment described above, only one thermal dissipation mechanism 5 is installed; however, two or more thermal dissipation mechanisms 5 may be installed.

REFERENCE SIGNS LIST

3: Housing
5: Thermal dissipation mechanism
51: Thermal transfer part
52: Thermal dissipation part
6: Seal member
7: Thermal insulation part
8: Attachment bolt
20: Drive unit
21: Electric motor
22: Battery
23: Electronic board
100: Thermal dissipation structure
101: Heat-generating element
524: Screw hole

What is claimed is:

1. A thermal dissipation structure for cooling a heat-generating element, the thermal dissipation structure comprising:
   a housing accommodating the heat-generating element and having a wall with an opening formed therein;
   a thermal dissipation mechanism extending through the opening and between an interior of the housing and an exterior of the housing, the thermal dissipation mechanism including a thermal transfer part and a thermal dissipation part, the thermal transfer part disposed inside the housing, the thermal transfer part configured to transfer heat generated by the heat-generating element, the thermal dissipation part disposed outside the housing; and
   a seal member that forms an airtight seal between the wall of the housing and a portion of the thermal dissipation mechanism such that air cannot pass into the housing through the opening.

2. The thermal dissipation structure according to claim 1, wherein the thermal dissipation mechanism is a heat sink provided as a single member.

3. The thermal dissipation structure according to claim 1, further comprising:
   a thermal insulation part disposed to surround the thermal transfer part.

4. The thermal dissipation structure according to claim 1, further comprising:
   an attachment bolt penetrating the housing to extend outside of the housing, wherein
   the thermal dissipation part includes a screw hole not penetrating therethrough, and
   the attachment bolt is screwed into the screw hole.

5. The thermal dissipation structure according to claim 1, wherein
   the opening is directed in a horizontal direction.

6. The thermal dissipation structure according to claim 5, further comprising:
   an electronic board disposed inside the housing, wherein
   the heat-generating element is attached to the electronic board, and
   the electronic board is disposed to be opposed to the opening.

7. A drive unit comprising:
the thermal dissipation structure recited in claim 1;
a battery disposed inside the housing; and
an electric motor driven by the battery.

\* \* \* \* \*